(12) United States Patent
Berr et al.

(10) Patent No.: US 9,853,639 B2
(45) Date of Patent: Dec. 26, 2017

(54) COOKING APPLIANCE WITH A SENSOR CONTROL PANEL

(75) Inventors: Andreas Berr, Krailling (DE); Michael Hegendörfer, Gröbenzell (DE)

(73) Assignee: BSH Hausgeräte GmbH, Munich (DE)

( * ) Notice: Subject to any disclaimer, the term of this patent is extended or adjusted under 35 U.S.C. 154(b) by 172 days.

(21) Appl. No.: 14/344,357

(22) PCT Filed: Sep. 11, 2012

(86) PCT No.: PCT/EP2012/067732
§ 371 (c)(1),
(2), (4) Date: Mar. 12, 2014

(87) PCT Pub. No.: WO2013/041411
PCT Pub. Date: Mar. 28, 2013

(65) Prior Publication Data
US 2014/0353302 A1    Dec. 4, 2014

(30) Foreign Application Priority Data

Sep. 23, 2011  (DE) .................. 10 2011 083 344

(51) Int. Cl.
| H05B 3/68 | (2006.01) |
| H03K 17/96 | (2006.01) |
| F24C 7/08 | (2006.01) |

(52) U.S. Cl.
CPC ........... *H03K 17/9618* (2013.01); *F24C 7/08* (2013.01); *F24C 7/083* (2013.01); *F24C 7/086* (2013.01); *H03K 2217/96062* (2013.01); *H03K 2217/96066* (2013.01)

(58) Field of Classification Search
CPC ............ H03K 17/9618; H03K 17/962; H03K 2217/96062; H03K 2217/96066; F24C 7/08; F24C 7/081; F24C 7/082; F24C 7/083; F24C 7/086; G06F 3/0362
See application file for complete search history.

(56) References Cited

U.S. PATENT DOCUMENTS

| 2002/0118169 A1* | 8/2002 | Hinckley | G06F 3/0362 345/163 |
| 2011/0148773 A1* | 6/2011 | Rudolph | H03K 17/96 345/173 |
| 2011/0260990 A1* | 10/2011 | Ali | G06F 3/016 345/173 |

FOREIGN PATENT DOCUMENTS

| EP | 1273851 | * | 1/2003 |
| EP | 1273851 A2 | | 1/2003 |
| EP | 2065650 A2 | | 6/2009 |

OTHER PUBLICATIONS

International Search Report PCT/EP2012/067732 dated Nov. 21, 2012.

* cited by examiner

*Primary Examiner* — Shawntina Fuqua
(74) *Attorney, Agent, or Firm* — Michael E. Tschupp; Andre Pallapies; Brandon G. Braun

(57) ABSTRACT

A cooking appliance includes a cooktop having at least one sensor operating field. The at least one sensor operating field has at least one scroll field for step by step modification of a multi-value operating parameter of the cooking appliance. The at least one scroll field has a number of discretely disposed sensor keys which are disposed below a cooktop plate.

21 Claims, 3 Drawing Sheets

COOKING APPLIANCE WITH A SENSOR CONTROL PANEL

BACKGROUND OF THE INVENTION

The invention relates to a cooking appliance having a cooktop with at least one sensor operating field.

Cooking appliances of the type referred to in the introduction are known, which have a so-called slider as an operating element. A slider is an operating element, in which settable values of an operating parameter are disposed in a line. There are linear sliders embodied in a straight line and circular sliders with a circle-shaped embodiment. However it is not easy to set an operating parameter precisely with a slider, as the position assigned to a desired value of said operating parameter has to be found exactly using a finger. This may be problematic in particular for older people and/or while preparing food. This is the case particularly if a lot of values are to be able to be set using the slider. This means that either the positions associated with different values are close together or the slider must be embodied to be correspondingly large.

BRIEF SUMMARY OF THE INVENTION

The object of the present invention is to overcome the disadvantages of the prior art at least to some degree and in particular to enable more operator-friendly setting, in particular precise setting, of operating parameters of a cooking appliance.

This object is achieved according to the exemplary features described herein.

The object is achieved by a cooking appliance having a cooktop with at least one sensor operating field, the at least one sensor operating field having at least one scroll field for step by step modification of a multi-value operating parameter of the cooking appliance.

The provision of a scroll field has the advantage that it simplifies the setting of the multi-value operating parameter significantly, as in contrast to a so-called slider for example it is not necessary to find an absolute position associated with a specific end value, thereby improving reliability of operation. The step by step modification also allows a scroll field to be embodied in a much more compact manner than for example a slider, as the size of the scroll field is not bound by the size of the value range of the operating parameter.

An operating parameter assigned to the scroll field can therefore be modified step by step by swiping or stroking the scroll field. In particular a modification direction can be assigned to a swiping direction. For example the scroll field may increase or increment the assigned operating parameter when swiped in one direction and decrease it or decrement it when swiped in another direction.

Such an operating parameter can comprise in particular a heat setting or a time period, in particular a timer time.

In one development the at least one sensor operating field or the cooktop has just one scroll field. Operating parameters, e.g. a heat setting, of a number of hotplates in particular can be set by means of the one scroll field after a hotplate has been selected. Alternatively each hotplate may be assigned its own scroll field, so there is no need for the selection process.

In one preferred embodiment the scroll field has a number of discretely disposed sensor keys. The sensor keys used are for example touch-sensitive keys in a capacitive embodiment or with infrared technology. The sensor keys are positioned for example on a common circuit board at a distance from one another, the individual sensor keys preferably being disposed along a line. Additional components of the sensor key, for example conductive rubber cylinders or contact springs, which establish a conductive connection between a sensor field on the printed circuit board and an operating field of the cooktop, are fastened to the circuit board. The scroll field preferably has fewer than 12 sensor keys, in particular fewer than 5 sensor keys.

In a further embodiment the sensor keys are disposed below a cooktop plate, in particular a glass ceramic plate. The sensor keys here are configured in such a manner that they act through the cooktop plate or glass ceramic plate so that operation of the sensor keys or scroll field can take place from an upper face of the cooktop plate or glass ceramic plate. The cooktop plate or glass ceramic plate is therefore not opened up for the scroll field, which is advantageous in respect of ease of cleaning. Electrical components of the scroll field are also protected from moisture.

In order to achieve an economical scroll field that is easy to produce, the sensor keys of the scroll field are at a distance of at least 1 mm, in particular at least 4 mm, from one another. The distance here is to be understood to be the shortest distance between the two touch-sensitive surfaces of two adjacent sensor keys. Such a configuration has the advantage that manufacturing systems and techniques that have commonly been used until now to produce display and operating units for cooktops can also be used to produce the scroll field.

In one embodiment printing applied to a surface of the sensor operating field is assigned to the at least one scroll field. The scroll field can thus be embodied in a particularly simple and low-cost manner. An effect of actuating the scroll field (by swiping) can be monitored for example based on a changing value of the operating parameter, as can be displayed in a display.

In a further embodiment at least one scroll field is a linear scroll field. A linear scroll field can be embodied in a particularly compact manner. Therefore a linear scroll field is particularly suitable if the at least one sensor operating field has a number of scroll fields, e.g. one scroll field for each hotplate of the cooktop.

In a further embodiment the printing has surface elements lined up in the longitudinal direction of the linear scroll field, the width of the surface elements decreasing from a center of the scroll field toward the edge of the scroll field in relation to the longitudinal direction. This visually imitates the knurling of an edge of a wheel, facilitating intuitive operation in the same manner as a rotary knob.

In one development the surface elements are rectangular surface elements, it being possible for a central surface element to be in particular a square surface element. It is thus possible to imitate knurling visually in a particularly effective manner.

In a further embodiment the printing has arrows lined up in the longitudinal direction of the linear scroll field, the alignment of the arrows in relation to the longitudinal direction changing at a center of the scroll field. This allows even more intuitive operability of the scroll field to be achieved. The arrows can be aligned in particular in the direction of the (longitudinal) end to which they are nearest. Thus arrows in a right half of the scroll field in particular can point to the right and arrows in a left half of the scroll field can point to the left. The center then separates the resulting two groups of arrows.

In a further embodiment at least one scroll field is a circular scroll field. A circular scroll field has the advantage that any number of modifications can be performed without removing a finger.

In one specific embodiment a further operating field is disposed in a center of the circular scroll field. This allows a space-saving arrangement of operating fields of the sensor field to be achieved. Such an operating field can be for example a main switch for the cooktop.

In a further embodiment the sensor operating field has a circular scroll field for setting operating parameters of a number of hotplates and a specific hotplate can be selected by touching a sector of the circular scroll field assigned to the specific hotplate. It is thus not necessary to provide dedicated selection keys to select a specific or desired hotplate before being able to set an operating parameter of said specific hotplate. This allows a particularly compact and economical sensor operating field to be achieved.

The operating parameters can comprise heat settings in particular.

Touching may, in particular in contrast to the setting or adjusting of an operating parameter, not be swiping but may be simple touching (e.g. tapping) on a point or sector of the circular scroll field. However such touching and subsequent adjusting of an operating parameter may be performed with a single movement, in other words without having to remove a finger from the scroll field.

In another embodiment an arrangement of sectors assigned to the hotplates corresponds at least essentially to an arrangement of the hotplates. This allows particularly intuitive operator guidance when selecting a hotplate. If for example the hotplates are disposed at least approximately in a square 2×2 field, all the sectors, which are disposed "top right", "bottom right", "bottom left" and "top left", can be assigned to similarly positioned hotplates.

Sectors not assigned to a specific hotplate can in particular be allocated other functions, if they are touched correspondingly (in particular not swiped), e.g. a timer function, fast boil or zone activation. Scroll fields can generally also serve as keys.

In a further embodiment the at least one scroll field is coupled to a vibration generation facility, the vibration generation facility causing a surface of the sensor operating field to vibrate when a scroll field is actuated, at least in the region of the actuated scroll field. A user of the scroll field thus receives haptic feedback when actuating the scroll field, allowing greater operating accuracy and enhanced user-friendliness.

In a further development the at least one scroll field is coupled to a tone generation facility, e.g. a loudspeaker, the tone generation facility outputting acoustic signals, e.g. a sequence of clicks, when the scroll field is actuated.

In a further development an activity of the vibration generator facility and/or the tone generation facility can be deactivated when the scroll field is actuated. This allows particularly operator-friendly adaptation of the sensor operating field to the needs of the user.

In a further development the sensor operating field is a sensor screen. This allows a scroll field to be displayed in a virtual manner. This allows a particularly visually pleasing and variable embodiment.

In a further embodiment the at least one scroll field has a delay. A scroll field with a delay refers in particular to a scroll field which can be used to adjust an operating parameter for a specific (short) (delay) period after the scroll field has been swiped. The delay period can in particular be a function of a (swipe) speed, at which the scroll field was swiped, in particular before the end of swiping, for precise setting of the operating parameter to be adjusted. It may therefore be possible in particular to prevent a delay by keeping a finger briefly on the scroll field at the end of a swiping movement so the swipe speed is reduced to zero.

The cooking appliance can be a cooker or a separate cooktop for example.

The cooking appliance can be in particular a domestic cooking appliance and should then be such that it can be operated more easily by non-professionals, in particular including older people.

BRIEF DESCRIPTION OF THE DRAWINGS

The invention is described schematically in more detail in the figures which follow based on an exemplary embodiment. Identical elements or those of identical function are shown with identical reference characters for the sake of clarity.

DETAILED DESCRIPTION OF EXEMPLARY EMBODIMENTS OF THE PRESENT INVENTION

Figure 1:
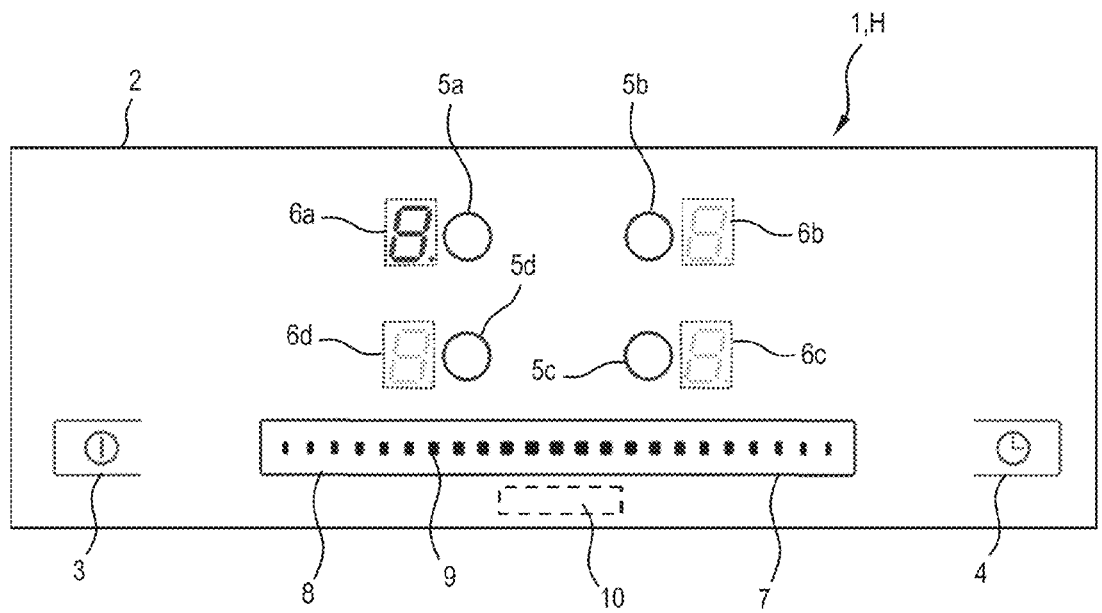
FIG. 1 shows a top view of a section of a cooktop with a sensor operating field comprising a linear scroll field.

FIG. 1 shows a top view of a section of a cooktop 1 of a cooking appliance H, for example a cooker, in the region of a sensor operating field 2. The sensor operating field 2 has a number of sensor keys, specifically comprising a main switch 3 for switching the cooktop 1 on and off and a timer key 4 for activating a timer. The sensor operating field 2 also has four activation keys 5a-d for activating respectively assigned hotplates. The activation keys 5a-d can therefore be used to select the hotplate that can currently be set (or the operating parameters of which can currently be set) and to activate or deactivate the assigned hotplate. A heating setting display 6a-6 is assigned in an adjacent manner to each of the activation keys 5a-d.

Present between the main switch 3 and the timer key 4 and below the activation keys 5a-d is a linear scroll field 7, which is aligned horizontally. The scroll field 7 can be identified by printing 8 on a surface of the cooktop 1, e.g. on a glass ceramic plate. Disposed on the lower face of the glass ceramic plate on a circuit board to form the scroll field 7 are eleven individual sensor fields (not shown) which are spaced 5 mm apart from one another. The sensor fields are formed by metal, essentially circular, surfaces, which are wired with corresponding electronic components. A gap between sensor field and glass ceramic plate is bridged by conductive rubber cylinders, which hold the sensor field against the lower face of the cooktop 1 or the glass ceramic plate. The scroll field 7 is made up of eleven sensor keys, which are each made up of the sensor field, the electronic components and the conductive rubber cylinder and can be operated through the glass ceramic plate.

The scroll field 7 can be used to modify or adjust a currently settable, multi-value operating parameter step by step by swiping or stroking the scroll field 7 along its longitudinal direction. If for example a hotplate disposed top left is to be operated, the main switch 3 is actuated first. No further settings are required and the heat setting displays 6a-d are deactivated (as shown) or alternatively display for example "0". To set a heat setting of the top left hotplate the (relatively speaking) similarly disposed, in other words top left here, activation key 5a is first actuated, whereupon the associated heat setting display 6a displays a "0". The heat setting is then increased or incremented by swiping the scroll field 7 from left to right, until a desired value of the hotplate is displayed and set. The heat setting can be decreased or decremented by swiping the scroll field 7 in the opposite direction from right to left. The associated hotplate is then energized according to the heat setting displayed and set in the heat setting display 6a by actuating the activation key 5a once again. However it is also possible to dispense with separate actuation of the activation key 5a to activate the associated hotplate and in particular bring about activation at the end of the swiping of the scroll field.

A cooking time or timer time may also first be set for this hotplate, for example by actuating the timer key 4, also setting the timer time by means of the scroll field 7 in a manner similar to that of setting the heat setting and further actuation of the timer key 4.

The scroll field 7 is embodied with a delay, which means that the operating parameter (e.g. the heat setting or timer time) can also be adjusted for a specific (short) (delay) period after the scroll field has been swiped. This allows in particular reliable and fast setting to maximum values (e.g. to a minimum heat setting "0" or a maximum heat setting "9") or to high parameter values (e.g. to high timer times).

For more intuitive operation of the scroll field 7 its printing 8 has rectangular surface elements 9 lined up in the longitudinal direction of the linear scroll field 7, the width of the surface elements 9 decreasing from a center of the scroll field 7 toward the edge of the scroll field 7 in relation to the longitudinal direction. This imitates a knurling of an edge of a wheel as an adjustment element.

The scroll field 7 may also be coupled to a vibration generation facility 10, the vibration generation facility 10 causing a surface of the sensor operating field 2 to vibrate when a scroll field 7 is actuated, at least in the region of the scroll field 7.

Figure 2:
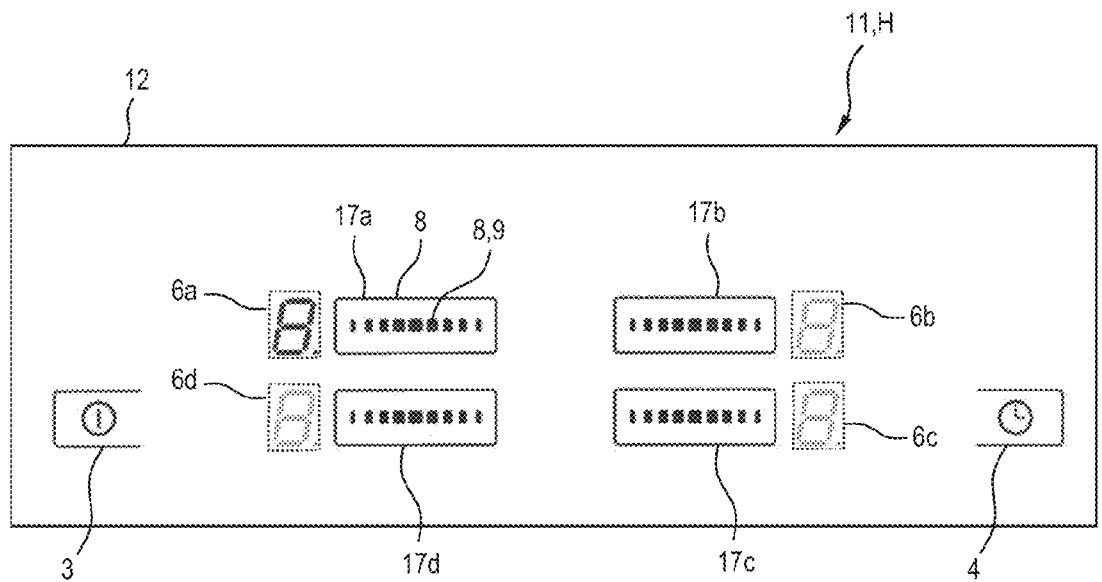
FIG. 2 shows a top view of a section of a cooktop with a sensor operating field comprising a number of linear scroll fields.

FIG. 2 shows a top view of a section of a cooktop 11 with a sensor operating field 12. The sensor operating field 12 is similar in structure to the sensor operating field 2 apart from the fact that there are now a number of linear scroll fields 17a-d present, which are assigned in a fixed manner to a respective hotplate. The activation keys 5a-d can therefore also be dispensed with. It is therefore possible to adjust a heat setting of a specific hotplate by directly swiping the associated scroll field 17a-d.

However each of the scroll fields 17a-d may also have a simple actuation function, in that the scroll field 17a-d is pressed and not swiped, for example to start a cooking operation.

The scroll fields 17a-d here are configured as very short and therefore compact but the simply step by step modification using the scroll fields means that there is no or no significant loss of setting accuracy.

Figure 3:
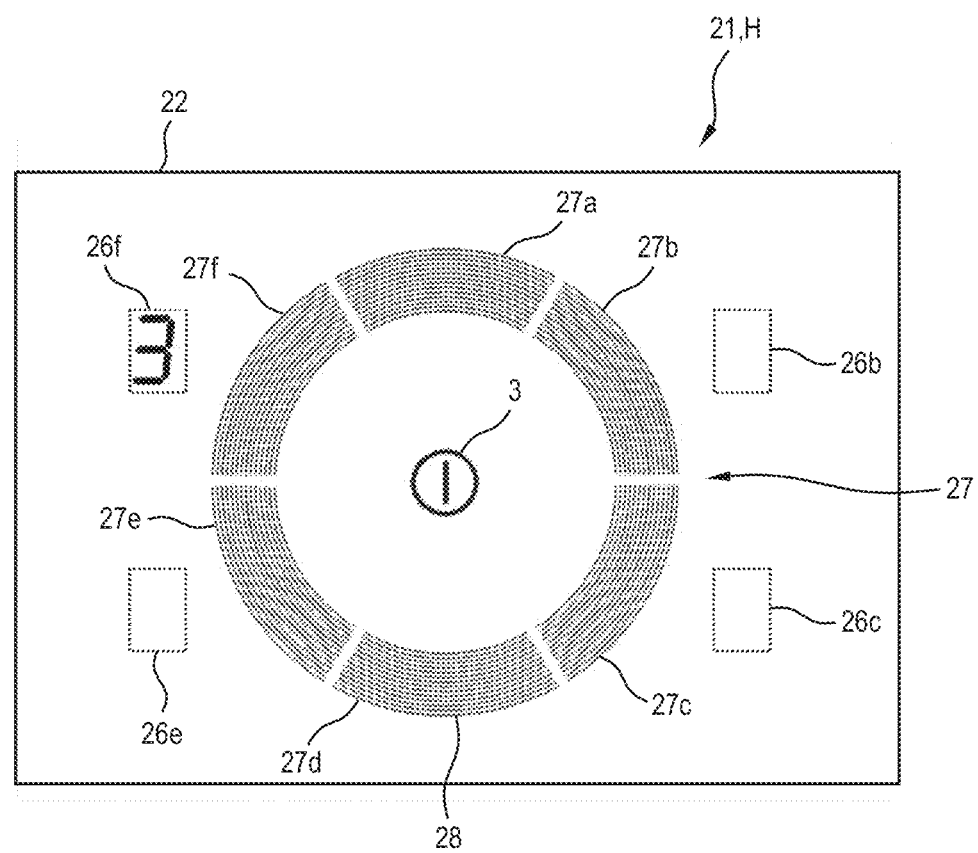
FIG. 3 shows a top view of a section of a cooktop with a sensor operating field comprising a circular scroll field.

FIG. 3 shows a top view of a section of a cooktop 21 with a sensor operating field 22 comprising a circular scroll field 27. The circular scroll field 27 is divided into six circle sectors 27a-f, which represent part of the printing 28. A heat setting display 26b, 26c, 26e and 26f of respective hotplates is disposed respectively adjacent to the circle sector 27b disposed top right, the sector 27c disposed bottom right, the circle sector 27e disposed bottom left and the circle sector 27f disposed top left.

Disposed in the center of the circular scroll field 27 is the main switch 3, allowing a particularly compact embodiment.

However each of the circle sectors 27a-f may also have a simple actuation function in that the circle sectors 27a-f are pressed and not swiped, for example to start a cooking operation.

The selection of a specific hotplate (e.g. for its activation and/or for setting assigned operating parameters such as a heat setting) is enabled by touching a circle sector 27b, 27c, 27e or 27f assigned to the specific or desired hotplate.

If therefore a heat setting of the top left hotplate is to be set for example, the similarly disposed top left circle sector 27f may first be actuated, for example by simple tapping. This circle sector 27f (like the other circle sectors 27a-e in principle) can therefore also be used as a key, in this instance an activation key. This activates the adjacent heat setting display 26f so that it displays "0" first. The heat setting of this hotplate can be incremented for example by stroking or moving off the circular scroll field 27 clockwise and can be decremented by stroking or moving off counter clockwise. The hotplate may be activated by tapping on the top left circle sector 27f again.

In principle the hotplate can also be activated and an associated heat setting can be adjusted by means of a single stroking movement, if this stroking movement starts on the associated circle sector 27f.

Generally for an intuitively comprehensible assignment of the circle sectors 27a-f to the hotplates, an arrangement of the circle sectors 27b, 27c, 27e, 27f assigned to the hotplates corresponds at least essentially to an arrangement of the hotplates. However another arrangement is in principle also possible.

The upper circle sector 27a and the lower circle sector 27f may have their own key functions, for example as a timer key or a fast boil key.

Figure 4:
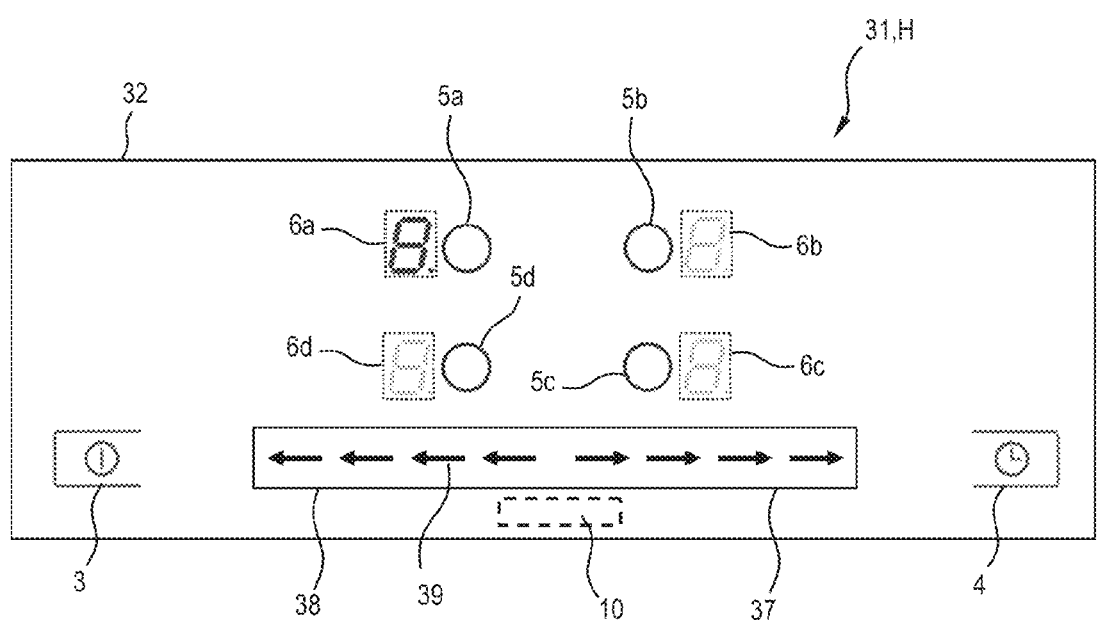
FIG. 4 shows a top view of a section of a cooktop with a sensor operating field comprising a further linear scroll field.

FIG. 4 shows a top view of a section of a cooktop 31 with a sensor operating field 32. The sensor operating field 32 is similar in structure to the sensor operating field 2, apart from the fact that the linear scroll field 37 now has printing 38, which has arrows 39 instead of the surface elements 9.

The arrows 39 are aligned in such a manner that their alignment in relation to a (horizontal in this instance) longitudinal direction of the linear scroll field 37 changes at a center of the scroll field 37. Of the eight arrows 39 therefore the four left arrows 39 point in the left direction and therefore in the direction of the next narrow side or longitudinal end of the scroll field 37 for said arrows 39, while the four right arrows 39 point similarly in the right direction to the next narrow side for said arrows 39. This allows more intuitive operability of the scroll field to be achieved, in particular for users who are not familiar with the function of a rotary knob.

It goes without saying that the present invention is not restricted to the exemplary embodiments shown.

Fewer or more than four hotplates can therefore be present and operated by a scroll field.

Also instead of printing a corresponding decoration can be etched, ground, incised or lasered into a surface of the cooktop or vapor-deposited, etc. thereon.

The invention claimed is:

1. A cooking appliance, comprising:
   a cooktop including at least one sensor operating field and a plurality of hot plates, said at least one sensor operating field having:

at least one scroll field for step by step modification of a multi-value operating parameter of the cooking appliance, the at least one scroll field allowing for modification based on an actuation speed; and an activation key corresponding to each of the plurality of hot plates, a specific hot plate of the plurality of hot plates being selectable by touching the activation key assigned to the specific hotplate for the step by step modification of multi-value operating parameters of the specific hotplate using the at least one scroll field.

2. The cooking appliance of claim 1, wherein the scroll field has a number of discretely disposed sensor keys.

3. The cooking appliance of claim 2, further comprising a cooktop plate, said sensor keys disposed below the cooktop plate.

4. The cooking appliance of claim 3, wherein the cooktop plate is a glass ceramic plate.

5. The cooking appliance of claim 2, wherein the sensor keys of the scroll field are spaced from one another at a distance of at least 1 mm.

6. The cooking appliance of claim 2, wherein the sensor keys of the scroll field are spaced from one another at a distance of at least 4 mm.

7. The cooking appliance of claim 1, wherein the sensor operating field has a surface provided with a printing assigned to the at least one scroll field.

8. The cooking appliance of claim 1, wherein the at least one scroll field is a linear scroll field.

9. The cooking appliance of claim 8, wherein the printing has surface elements lined up in a longitudinal direction of the linear scroll field, said surface elements having a width decreasing from a center of the scroll field toward each edge of the scroll field in relation to the longitudinal direction.

10. The cooking appliance of claim 8, wherein the printing has arrows lined up in a longitudinal direction of the linear scroll field, said arrows being aligned in relation to the longitudinal direction of the linear scroll field changing at a center of the scroll field.

11. The cooking appliance of claim 1, wherein the at least one scroll field is a circular scroll field.

12. The cooking appliance of claim 11, further comprising a further operating field disposed in a center of the circular scroll field.

13. The cooking appliance of claim 11, wherein the circular scroll field includes a plurality of discrete sectors for setting an operating parameter of a plurality of hotplates, a specific one of the plurality of hotplates being selectable by at least one of touching and swiping a discrete sector of the plurality of discrete sectors of the circular scroll field, wherein the discrete sector is assigned to the specific one of the plurality of hotplates.

14. The cooking appliance of claim 13, wherein an arrangement of the plurality of discrete sectors corresponds at least essentially to an arrangement of the plurality of hotplates.

15. The cooking appliance of claim 1, further comprising a vibration generation facility coupled to the at least one scroll field and configured to cause a surface of the sensor operating field to vibrate when the scroll field is actuated, at least in a region of the scroll field being actuated.

16. The cooking appliance of claim 1, wherein the at least one scroll field has a delay as a function of the actuation speed.

17. A cooking appliance comprising:
a cooktop, the cooktop including:
a plurality of hot plates;
at least one sensor operating field,
wherein the at least one sensor operating field includes at least one scroll field for step by step modification of multi-value operating parameters of the plurality of hotplates, wherein the at least one scroll field is a circular scroll field and includes a plurality of discrete sectors for setting an operating parameter of the plurality of hot plates, a specific one of the plurality of hot plates being selectable by at least one of touching and swiping a discrete sector of the plurality of discrete sectors of the circular scroll field, wherein the discrete sector is assigned to the specific one of the plurality of hotplates.

18. The cooking appliance of claim 17, wherein the at least one sensor operating field includes an activation key corresponding to each of the plurality of hotplates, a specific hotplate of the plurality of hotplates being selectable by touching the activation key assigned to the specific hotplate for the step by step modification of multi-value operating parameters of the specific hotplate using the at least one scroll field.

19. The cooking appliance of claim 17, wherein the at least one sensor operating field includes at least one of a selection key and a selection field configured to select a specific hotplate of the plurality of hotplates for the step by step modification of multi-value operating parameters of the specific hotplate using the at least one scroll field.

20. The cooking appliance of claim 17, comprising:
a further operating field disposed in a center of the circular scroll field.

21. A cooking appliance, comprising:
a cooktop including at least one sensor operating field and
a plurality of hot plates, said at least one sensor operating field having:
at least one scroll field for step by step modification of a multi-value operating parameter of the cooking appliance, the at least one scroll field allowing for modification based on an actuation speed; and
a selection field configured to select a specific hotplate of the plurality of hot plates for the step by step modification of multi-value operating parameters of the specific hot plate using the at least one scroll field.

* * * * *